United States Patent [19]

St-Amant et al.

[11] Patent Number: 5,423,974
[45] Date of Patent: Jun. 13, 1995

[54] PLASTIC SUPPORTED METALLIC SHEETS OBTAINED BY METALLIZATION-PLATING

[75] Inventors: Guy St-Amant, Trois-Riviéres West; Claude Carignan, Shawinigan-South, both of Canada

[73] Assignee: Hydro-Quebec, Montreal, Canada

[21] Appl. No.: 314,522

[22] Filed: Sep. 19, 1994

Related U.S. Application Data

[63] Continuation of Ser. No. 945,893, Sep. 17, 1992, abandoned.

[30] Foreign Application Priority Data

Sep. 17, 1991 [CA] Canada ............... 2051604-6

[51] Int. Cl.⁶ .................. C23C 14/24; C25D 5/56
[52] U.S. Cl. ............................ 205/50; 205/165; 205/230; 205/233
[58] Field of Search ............ 205/50, 165, 230, 233

[56] References Cited

FOREIGN PATENT DOCUMENTS 321687 12/1989 Japan.
0321687 12/1989 Japan.

Primary Examiner—John Niebling
Assistant Examiner—Edna Wong
Attorney, Agent, or Firm—Oblon, Spivak, McClelland, Maier, & Neustadt

[57] ABSTRACT

Metallization under vacuum, on at least one face of a plastic film so as to give a substrate including a metallic surface, which substrate is sufficiently electrically conductive to permit a uniform electrochemical deposit. The latter is carried out by electrochemical plating, of at least one metal, on the metallized surface starting from an electrolytic solution, so as to give a thin metallic film having a metal thickness between 0.1 and 4 microns. The metallized substrate is selected so as to be compatible and to facilitate the step of electrochemical plating. The thin metallic sheet obtained is adherent to and supported by the plastic film. The metallic sheet may be used as current collectors for polymer electrolyte lithium batteries, as multi-layer film used as wrapping material permeable to gases and humidity, as a screen for light, flexible conductors, etc.

4 Claims, 3 Drawing Sheets

PLASTIC SUPPORTED METALLIC SHEETS OBTAINED BY METALLIZATION-PLATING

This application is a Continuation of application Ser. No. 07/945,893, filed on Sep. 17, 1992, now abandoned.

BACKGROUND OF THE INVENTION (a) Field of the Invention

The invention concerns a process for preparing a plastic supported metallic sheet, obtained by metallization-plating, as well as the metallic sheet resulting from this process. More specifically, the invention is concerned with a process for the preparation of metallic films consisting of at least one metal which is deposited by metallization on a non-conductive plastic film, the product obtained being covered with another metal by electrochemical plating, these metallic films having a thickness within the range of 0.1 to 4 microns.

(b) Description of Prior Art

The manufacture of thin metallic films is faced with difficulties when the thicknesses used are of the order of a micron. These difficulties signify high costs and leave only a limited choice of metals to be used. The three main industrial methods actually used are laminating, electro-forming on a mandrel and metallization. The minimum thickness obtained by the first two methods are of the order to 5 to 20 microns and the film produced is free. Metallization should be carried out on a plastic support and the thickness normally obtained on plastic does not exceed 0.1 microns by much.

Among the industrial processes presently available for the manufacture of thin films less than 15 microns, laminating is the more currently used. The latter consists in reducing the thickness of the sheet by passing it between two rollers on which a pressure is applied. However, few metals are laminated at these thicknesses (for example: Au, Al, Pb, brass, stainless steel) and, generally, the costs increase rapidly and the capacity of the processes decreases rapidly for thicknesses below 50 to 5 microns, by virtue of the number of passes required for laminating, the fact that the films having a low mechanical resistance are hard to handle, the appearance of perforations during the processes, as well as problems of reheatings and contamination with lubricants. Moreover, the minimum thicknesses which are commercially available (12 microns for stainless steel, 6–7 microns for aluminum) are still not acceptable and are penalizing in cost, material, weight or dead volume for many applications. The final product obtained by laminating is a coil of a rectangular metallic sheet.

Electro-forming is a plating technique wherein the free and self-supported metallic film is obtained by electrochemical deposit, from an electrolytic solution, on an electronic conductive mandrel. The manufacturing costs are high (about 1$ US/ft$^2$ for nickel) and the minimum available thicknesses are 6 microns for nickel and 10 microns for copper. This technique is applicable to certain materials only and, the necessity to handle and peel a free film after deposit, requires minimum thicknesses otherwise it would not be possible to peel the film from the mandrel without running the risk of damaging the film. Electro-formed copper films are produced in large quantity and are mainly used for the manufacture of printed circuits. The final product obtained by electro-forming a metallic sheet is a coil of rectangular shape.

Metallization or vacuum deposit consists in evaporating a metal for depositing same on a support. The most current processes are: metallization by vaporization and assisted vaporizations such as cathodic pulverization and pulverization by beam of electrons. The process of vaporization is mostly used. It consists in heating the metal so that its vapor pressure be significantly higher than the pressure in the vacuum chamber. The quantity of metal that may be evaporated is dependent on the temperature used (1200° C. for Al and copper) and the surface of the bath. The maximum thicknesses deposited are dependent on the process and the heat resistance of the substrate. The thicknesses of the metallizations on plastic materials rarely exceed 0.5 micron and are generally of the order of 0.01 micron. The thickness of the metallization is limited inter alia by overheating of the plastic. The deposits obtained on plastic are currently used in applications where the metallized thickness requires no thick deposits, i.e. <0.1 micron, such as decorative metallizations, barrier against gas diffusion, current collectors of plastic condensers, partially reflecting coatings, etc. These metallizations are fragile, and, because of their small thickness, they are also not very conductive of electricity, generally of the order 0.5 to >100 ohm/square.

Plating on plastic is used, inter alia, in the automobile industry. The process is used in 85% of the cases to plate molded ABS articles. The first steps required before plating are: cleaning in an alkaline solution, rinsing, oxidation of the surface by means of a chromic based solution, neutralization to remove hexavalent chromium, rinsing, tin and palladium based catalytic bath, accelerated to remove tin and expose palladium, rinsing, autocatalytic plating with nickel or copper. After these steps, the articles are covered with about 0.12 to 0.75 micron of copper and may receive other plating.

The thicknesses which are proposed according to the present invention are not accessible to laminating, and metallization under vacuum enables at the most with certain heat resistant plastics to reach values lower than the range provided by the invention and this, at the price of a substantial slowing down of the process.

Contrary to the invention, the process of plating on plastic used in the prior art implies the use of a specific plastic and a number of chemical treatments. The process of plating on plastic requires apparatuses for controlling pollution, because of the use of metals such as hexavalent chromium. The raw material used in the process of plating on plastic has a rough surface because of the nature of the process according to which the plastic is oxidized and catalyst sites are produced for the autocatalytic deposit.

The invention aims at a process according to which the surface condition of the metallic precursor which is deposited under vacuum perfectly follows the plastic surface, which enables to obtain the desired surface.

Another object of the invention is to permit the treatment of only one face of the plastic film when this is desirable, while with the plating on plastic of the prior art all the surfaces of the articles are treated.

Another object of the invention is to enable an operation which is very regular ensuring a very precise control of the thicknesses, this being much more difficult with plating on plastic because of the number of steps and the notion of activation sites.

Another object of the invention resides in a process which is more simple than plating on plastic because of the limited number of operations to be carried out.

Another object of the invention consists in effecting the plating of the metal according to two methods: plating with imposed current and autocatalytic plating. Plating with imposed current enables speeds of plating which are much more rapid and the purity of the metal deposit is higher than with the autocatalytic plating.

Another object of the invention resides in the use of a conductive surface obtained by metallization under vacuum, which is very favorable to a metallic deposit which is rapid, uniform and chemically clean. No cleaning of the metallized surface is required before plating.

Another object of the invention consists in the production of sheets having a composite metallic structure; this possibility enables to optimize the properties of the product.

Another object of the invention is to select the last plated metal as a function of its resistance to corrosion, its weldability, its compatibility with a glue, etc. The underlying metal(s) are selected as a function of their conductivities, their mechanical or electrical properties, etc.

Another object of the invention is to control the shape and surface conductivity of the electrodeposited zones as a result of the utilization of well known techniques in galvanoplasty; this possibility has an advantage as compared to laminating. This advantage may be used to optimize the utilization of the materials.

Another object of the invention is to facilitate the handling in automatically operated apparatuses, of the metallic sheets produced, through the utilization of a plastic support.

Another object of the invention is to also enable to control the surface, thickness and shape of the parts where the electrochemical deposit will take place.

Another object of the invention is to enable to obtain in a same support, insulating zones, metallized zones, and zones having an electrochemical deposit of at least one metal, which is impossible with the processes of lamination, metallization and plating.

Another object of the invention is to additionally and optionally enable, the easy handling and the peeling of metallic coatings by transfer of adhesive materials with an appropriate control of the adhesion between the plastic support and the first deposit obtained by metallization under vacuum.

Another object of the invention resides in the utilization of metallic sheets for the manufacture of heating elements, thin metallic coatings to absorb or reflect light and/or heat metallic barriers to block the diffusion of gases in multi-layer wrappings and current collectors, such as in thin film batteries.

Another object of the invention is to use a metallic sheet as current collector of the electrodes of a thin film electrochemical generator.

The invention concerns a process for the manufacture of metallic sheets consisting of at least one metal supported on a non-conductive film of synthetic resin comprising the following steps:

metallization under vacuum, of at least one face of the plastic film so as to give a substrate including a metallic surface, said substrate being sufficiently electrically conductive to provide a uniform electrochemical deposit, deposit by electrochemical plating, of at least one metal on the metallized surface starting from an electrolytic solution, so as to give a thin metallic film having a metal thickness between 0.1 and 4 microns, the metallized substrate being selected so as to be compatible and facilitate the step of electrochemical plating, the thin metallic film obtained being supported by said plastic film. The metallization and the deposit by electrochemical plating may be carried out continuously.

The process of metallization under vacuum is preferably selected among simple or assisted thermochemical vaporization processes.

With respect to the assisted thermochemical vaporization, it is preferably carried out by cathodic polarization or with a beam of electrons.

According to an alternative embodiment, the metallized surface is controlled by concealing or demetallization processes, for example by laser beam, chemical dissolving, chemical removal or flashing.

The insulating non-conductive plastic film is preferably made of a synthetic resin selected for its compatibility with the vacuum conditions and the solutions associated with the process of galvanoplasty, for example polypropylene, polyester, polysulfone, polyethylene, or polyimide.

The substrate includes a metallized surface and preferably consists of substances which are compatible with the deposit by electrochemical plating, selected among the following metals: Cu, Au, Ag, Fe, Ni, Cr, Zn, Mo or alloys thereof, particularly Cu, Au, Ag or alloys thereof, whose surface resistance varies for example between 0.1 and 10 ohm/square.

According to another embodiment of the invention, metallization under vacuum is carried out so that the metallized surface covers only partially the surface of the insulating support film to leave non-conductive zones. A partial covering of the surface of the film by metallization of the insulating support film before the step of electrochemical deposit, may be obtained by the utilization of masks during metallization, by removal of the metallized deposit, for example by laser treatment, flashing, chemical or mechanical treatment.

It is also possible to cover the metallized surface with insulating masks to prevent local plating, which masks will, in certain cases, be removed thereafter. The metal which has been deposited by plating is for example selected from the following elements: Ni, Fe, Au, Ag or alloys thereof. Preferably, metallization is carried with copper and the metal deposited by plating comprises nickel. The metal deposited by plating is for example selected from the following elements: Ni, Fe, Au, Ag, Cr, Zn, Pd, Cd or alloys thereof.

The electrolytic plating solution of the autocatalytic type enables the utilization of a thinner metallization, than when an ordinary electrolytic solution is used. The metallic sheet may be covered with a plastic film, for example by laminating or gluing.

According to another embodiment of the invention, the metallic sheet is transferred entirely or partially, from the plastic support towards another surface whose adhesion with respect to the last plated metal is higher than that between the metallization and the plastic support. The metallic sheet may also be chemically treated to provide it with a low emissivity in ultraviolet.

The metallic sheets according to the invention may be used to constitute heating elements which may be integrated in a flexible or rigid unit, current collectors for batteries, for example polymer electrolyte lithium batteries, wrappings with a very low permeability, light screens, flexible conducts, etc.

The capacity of the metals to block, reflect or absorb radiations is well known. In some cases, the use of a flexible metallic film is very desirable. The product according to the invention combines, for a plurality of applications, the advantages of a plastic film for handling, of the metallic surface for opacity. The film may be used in different types of blinds to block light.

A modification of the surface of the sheet of nickel may, for example, produce a low emissivity of the ultraviolet rays. The use of a minimum thickness of nickel enables to preserve an excellent flexibility as compared to an electro-formed product. This product may be used to prevent systems for watching by night to be detected. It is also possible to coat the reverse side of the support film with an adhesive to make it possible to cover the surface to be protected.

The capacity of reflecting radiations may be used for utilization as vapor barrier. The facility of use of the plastic is then combined with the impermeability to gas, the reflectivity and the resistance to corrosion of the metallic coating such as nickel. The vapor barrier is therefore more efficient on a point of view of energy, duration and permeability.

The electrical resistance of the metallic film on plastic enables it to be used as a resistance to produce heat. This resistance may be used in ceilings for heating by radiation or as large surface heating element to heat liquids; the large heating surface prevents the formation of hot points which could deteriorate the content of the container.

It is preferable to select the plastic support as a function of the desired adhesion between the metallization and said support. To increase adhesiveness, the surface to be metallized may be treated by corona effect.

Metallization is normally carried out under vacuum by utilizing a metal which promotes the later electrochemical deposit so as to induce a sufficient electrical resistance to permit the flow of plating current (preferably lower than .10 ohm/square). If the electrical resistance is too high, the plating current should be limited because of the danger of overheating, which would decrease by the same amount the maximum speed of plating. It is possible, by the utilization of masks, to obtain non-metallized surfaces on the plastic support, for example, to obtain a non-metallized border along the length of the film.

A local covering of the metallization may be used to preserve non-plated metallized zones. These less conductive zones may be used as fuses, heating elements, or be later on dissolved.

The local demetallization may be carried out by removal with a laser beam, chemical solution, mechanical removal or flashing, when, for certain applications, the use of masks with the metallization appears to be difficult to realize.

The electrochemical deposit on the metallized film is carried out with at least one metal on the surfaces which are made conductive by metallization until obtaining a deposit of a thickness between about 0.02 and 4 microns. The conditions which are imposed during the electrochemical deposit are well known to one skilled in the art and are based on the electrolytic solution, the arrangement of the electrodes, the densities of current used which enable to optimize the density, conductivity and the surface condition of the electrochemical deposit. The plating speed which is possible with this process, and this without optimization, may reach 2 m/min when a thickness of 0.3 micron of nickel is deposited. Of course, during this step, it is possible to control the finish of the surface, the thickness and the resistivity of the consecutive electrochemical deposit(s), and this is made possible by varying the known parameters of the devices for electrochemical plating (current density, additives, covering, distance of the electrodes, etc.).

The demetallization of the plating deposit and/or of the metallization may be carried out by removal with a laser beam, mechanical removal or flashing when the demetallization is more practical than the use of a group of masks. Removal of the masks previously disposed may be carried out by any known means.

BRIEF DESCRIPTION OF DRAWINGS

The characteristics and advantages of the invention will be better illustrated by means of the examples which follow as well as the annexed drawings illustrating non-limiting embodiments. In the drawings.

DESCRIPTION OF PREFERRED EMBODIMENTS

Figure 1:
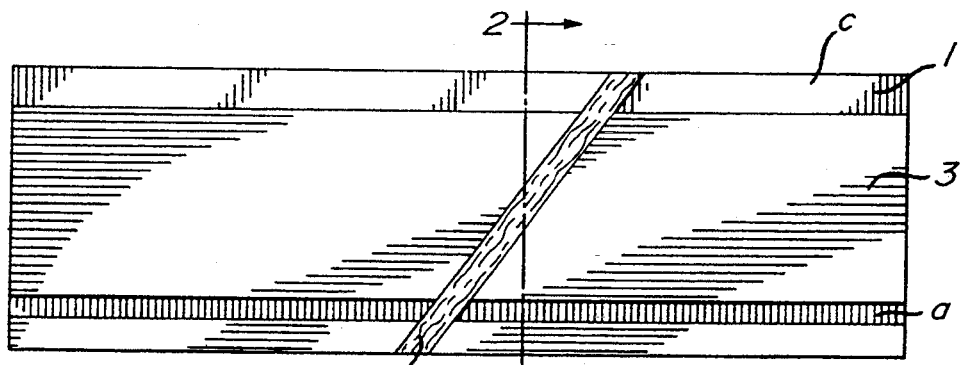
FIG. 1 is a plan view of a metallic sheet on plastic support according to the invention with non-metallized and unplated border.
Figure 2:
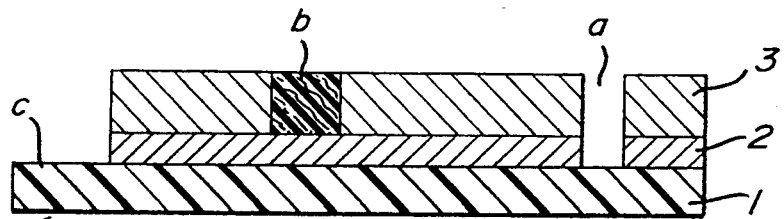
FIG. 2 is a cross-section taken along line 2—2 of FIG. 1.

With reference to FIGS. 1 and 2, it will be noted that the plastic support 1 is by way of example of polypropylene, 23 microns, and that the latter was surface treated by corona effect in order to give a better adhesiveness with metal 2 deposited by metallization; in the present case copper, whose surface conductivity is 0.5 $\Omega$/square. On the other hand, it is noted that there is a nickel deposit 3, 0.3 micron thick, obtained by electrochemical deposit. At a there is a zone which has been demetallized with laser and at b there is a transverse zone which is covered with insulating material.

Figure 3:
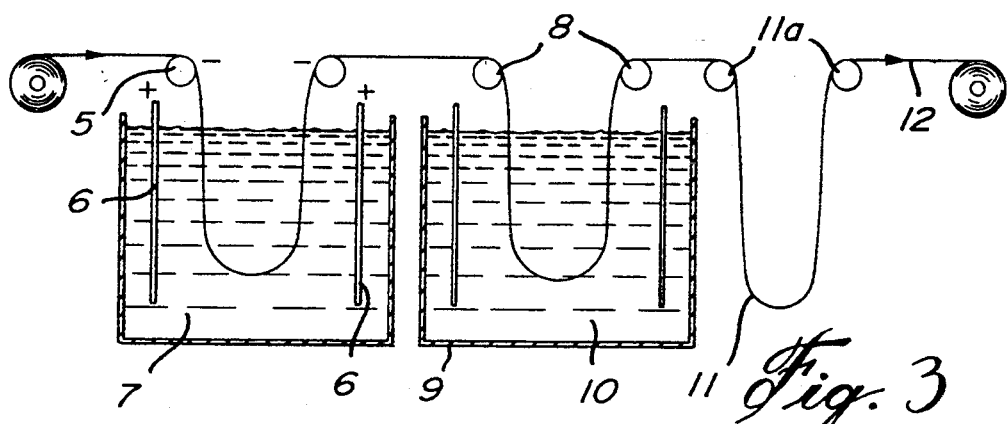
FIG. 3 is a schematic illustration of the step of plating on metallized plastic in the case where one single face of the support is plated.

FIG. 3 uses a roller of metallized film 4 obtained by metallization under vacuum. The metallized film 4 circulates around electrical contacts 5 with metallized surface, said contacts being connected to nickel electrodes 6 by means of an electrochemical plating solution 7. At the outlet of the plating solution 7, the roll of film plated at 7 circulates around rollers 8 in a vat 9 containing solution 10. The roller thereafter circulates in a drying section 11 around rollers 11a after which the supported metallic sheet obtained by plating at 7 is rolled at 12.

Figure 4:
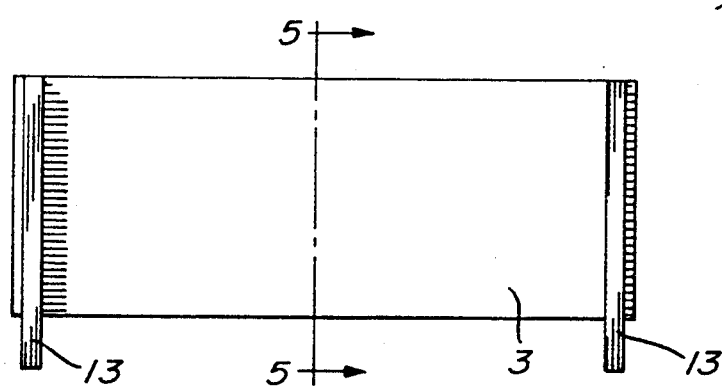
FIG. 4 is a schematic illustration of a heating panel with resistance.
Figure 5:
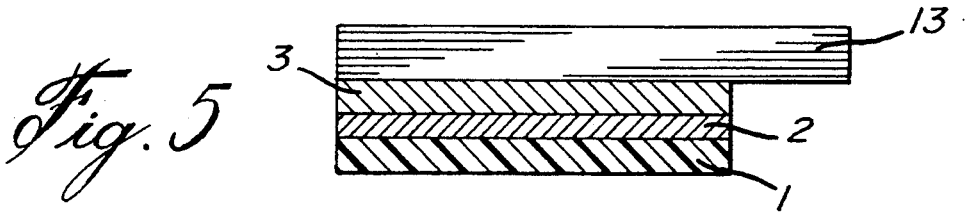
FIG. 5 is a cross-section taken along line 5—5 of FIG. 4.
Figure 6:
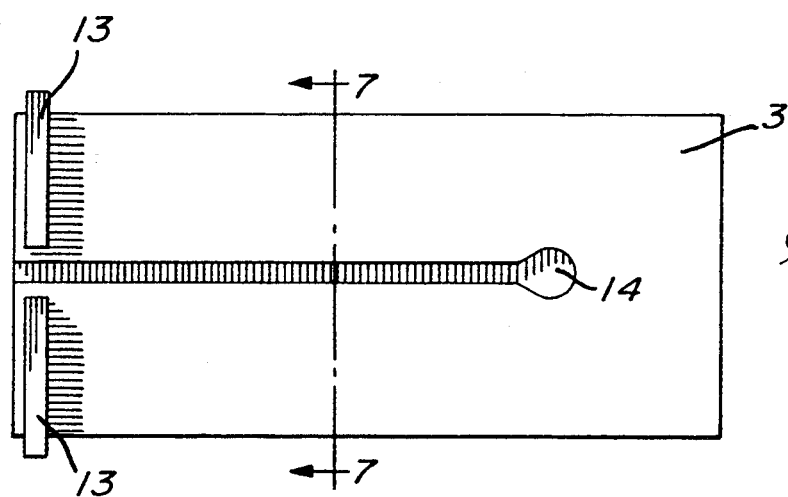
FIG. 6 is a view similar to FIG. 4, including a zone which has been demetallized with laser.
Figure 7:
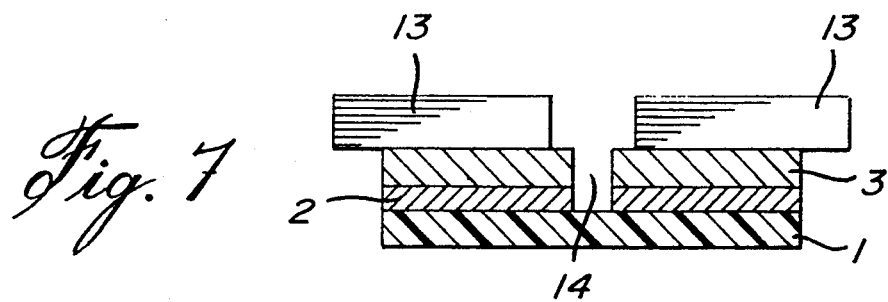
FIG. 7 is a cross-section view taken along line 7—7 of FIG. 6.

FIGS. 4, 5, 6 and 7 show a conductor 13 fixed to the metallic sheet and serving as current distributor. In FIGS. 6 and 7, there is a demetallized zone 14.

Figure 8:
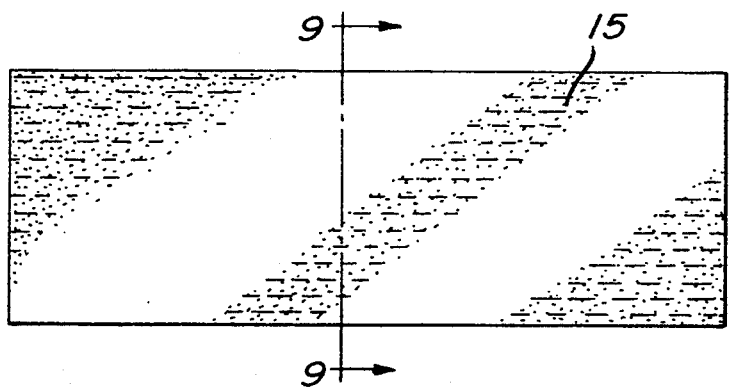
FIG. 8 is a schematic illustration, in plan view, of a coating with low emissivity in ultraviolet.
Figure 9:
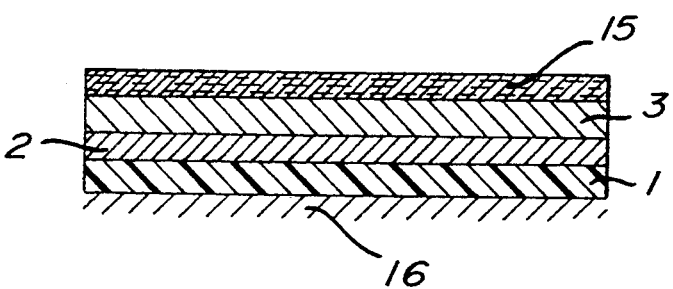
FIG. 9 is a cross-section view taken along line 9—9 of FIG. 8.

FIGS. 8 and 9 illustrate a MAXORB TM 15 designed by INCO enabling the deposit of nickel to have a low emissivity of ultraviolet rays.

Figure 10:
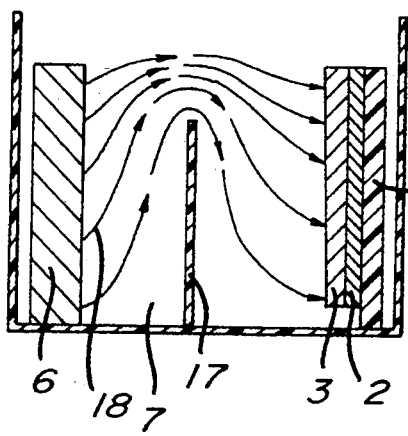
FIG. 10 is a schematic illustration of a method of obtaining a variation of the thickness of the plating.

In FIG. 10 it is seen that it is possible to obtain a variation in the thickness of the plating. To do this, an insulating material 17 is placed in the electrolytic plating solution to bypass the lines of current.

The examples which follow illustrate the invention without limitation.

EXAMPLE 1

This example illustrates the process for the production in two continuous steps of a film of nickel 0.3 micron thick, supported on polypropylene. In this example, copper metallization on polypropylene is obtained in continuous by evaporation under vacuum of copper on one of the faces of the plastic film which has previously been treated by corona effect. The processes of metallization of metals such as Al, Zn, Au are well known to those skilled in the art; the choice of copper, which is less documented, is made because this metal is particularly favorable to the electrochemical deposit of nickel. Copper is more economical than gold while zinc and aluminum in very thin layer are extremely difficult to plate in a satisfactory manner. The surface conductivity of the metallized deposit is 0.5 ohm/square. A hidden portion is used to obtain a non-metallized border.

The metallized film is used as such for the second step which consists in an electrochemical deposit of nickel in a device such as illustrated in FIG. 3. The plating solution is a solution of the type nickel sulfamate which is normally used to give deposit having low internal mechanical stresses. The current densities used during plating are from 0.05 to 0.3 A/cm$^2$ and the unwinding speeds obtained, without optimization of the process, are about 2 m/min for a deposit of 0.3 micron of nickel. The film is thereafter washed and dried by means of conventional processes. The sheet obtained is illustrated in FIGS. 1 and 2. In these Figures, there is shown a zone not having been metallized which has consequently not been plated c, a zone b covered with a mask (varnish) which also has not been plated, and a zone a which has been mechanically demetallized to prevent plating. In this example, demetallization in a has been carried out by means of an impulse laser. The thickness of the film of nickel obtained is 0.3 micron and its surface conductivity is 0.15 ohm/square.

Plating with thicknesses of the order of 0.3 micron produces an excellent flexibility. It is therefore possible to produce a plurality of passes on a radius of 2 mm without problem. Plating has a good coherence on its substrate, adhesion of nickel on copper is better than that of copper on polypropylene. The aspect of the deposit is brilliant for deposits of lower than about 0.8 micron. As the deposits become thicker, one comes close to the mat finish which characterizes a plating by means of a bath of nickel sulfamate. Of course, this finish may easily be modified by modification of the composition of the solution.

EXAMPLE 2

Process similar to example 1 in which the nickel thickness is increased to permit a chemical attack of its surface. In this case, the deposit of nickel is later on treated to give a low emissivity of the ultraviolet rays by the chemical process MAXORB TM, process developed and owned by INCO. The arrangement still has, in this case, an excellent flexibility and may be used to prevent the detection in systems of vision by night. It is also possible to coat the reversed side of the support film for an easier utilization.

EXAMPLE 3

Figure 11:
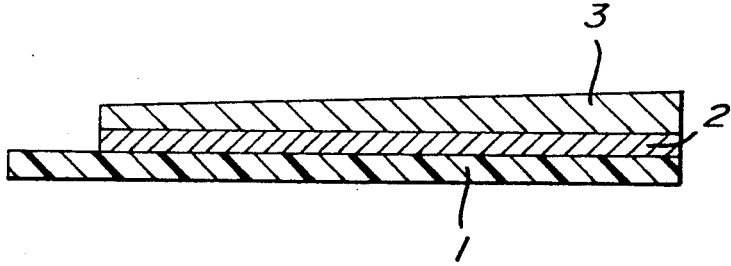
FIG. 11 is a cross-section view of a metallic sheet according to the invention which may be used as current collector according to the invention.

Example similar to example 1 in which the conditions of the electrochemical step are modified so as to control the thickness and the local conductivity of the deposit of nickel obtained. More specifically, the arrangement, the use of mask and the distance between the electrodes are modified so as to locally increase current densities. On a sample 10 cm wide it is thus possible to produce a variation of the lateral conductivity of the film from 0.3 to 0.91 ohm/square. Such a variant may be used to optimize the required thicknesses in current collectors which may be used in electrochemical generators. Examples of the process and device obtained are illustrated in FIGS. 10 and 11.

EXAMPLE 4

In this example, there is shown the possibility of utilizing a metallized substrate which is not copper to give an electrochemical deposit of nickel. A gold metallization is plated with copper then with nickel so as to give a total metallic thickness of 1 micron. The electrochemical deposits of copper and nickel are substantially of the same thickness in this case. Part of the sample is however treated more slowly (2 m/min vs 0.2 m/min) on the occasion of the deposit of nickel so as to illustrate the capacity of producing a thickness of nickel of 3 microns. One of the aims of this example is to illustrate the property of the process to be adaptable to various applications as long as metals which are compatible are used for demetallization and the electrochemical deposit.

EXAMPLE 5

Process similar to the process of example 1 in which the metallized plastic is used as a resistance to produce heat. The resistive paths are traced by mechanical demetallization or by an arrangement of bands of metallized plastic. FIGS. 4 and 5 show in cross-section and in plan a heating system. The main parts are metallization, plating and its support on which contacts were added and optionally an insulating coating. The maximum temperature of continuous operation of the system is function of the materials used. It may be of the order of 70° C. for polypropylene. The capacity of the system is related to the resistance between the outputs for a given voltage.

Figure 12:
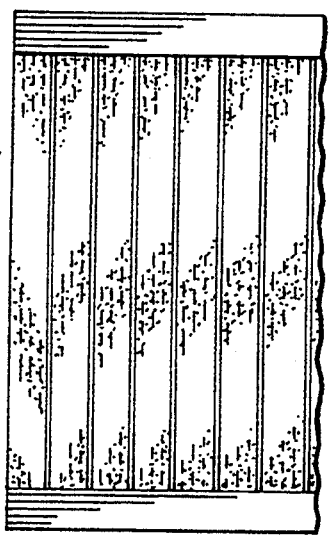
FIG. 12 is a plan view illustrating a large number of bands of metallic sheet supported on plastic and connected in parallel.

Typically, the resistance of a square surface of a metallic sheet supported on plastic is 0.15 ohm/square with a maximum permissible current of 500 mA/cm. Thus, with a metallic sheet support on plastic measuring L=80 cm and l=1 cm where L represents length and l represents width to which there is applied, along L, a voltage of 6 volts, there is obtained a total current of 500 mA. The power released by this element is 3 watts. It is therefore possible to obtain a power of 375 watts/meter square if there are used 125 bands of metallic sheets supported on plastic connected in parallel (see FIG. 12). In the residential field, the metallic supported on plastic may be used as vapor/barrier/heating element (long infrared radiation). The fact of supplying the sheet with a voltage of 6 volts makes the system very safe as compared to the systems of heating with long infrared already in existence which operate at 120 volts. In the automobile field the metallic sheet supported on plastic may also be used as heating element incorporated to doors, seats, roofs, etc.

The metallized and plated plastic according to the invention may also be used for its property to block or reflect light. In certain cases, the use of a flexible metallic film is very desirable. The film may be used in different types of blinds to block light. If it is laminated between two plastic materials, it is used only to block light. When it is laminated on one side only, it may be used as a mirror to give an effect of enlargement of the room.

We claim:

1. A process for preparing metallic sheets consisting of at least one metal supported on a non-conductive film of synthetic resin, said process comprising the following steps:
   (i) metallizing, under vacuum, at least one face of a plastic film so as to give a substrate having a metallic surface, said substrate being sufficiently electrically conductive to give a uniform electrochemical deposit;
   (ii) depositing by electrochemical plating, at least one metal on the metallized surface from an electrolytic solution, so as to give a thin metallic sheet having a metal thickness between 0.1 and 4 microns, the metallized substrate being selected so as to be compatible and facilitate the step of electrochemical plating, and the thin metallic sheet obtained being adherent and supported on said plastic film; and
   (iii) completely or partially transferring said metallic sheet from the plastic support to another surface having a higher adhesion with respect to the last plated metal than between the metallization and the plastic support.

2. A current collector for batteries, consisting of metallic sheets obtained by a process comprising the following steps:
   (i) metallizing, under vacuum, at least one face of a plastic film so as to give a substrate having a metallic surface, said substrate being sufficiently electrically conductive to give a uniform electrochemical deposit;
   (ii) depositing by electrochemical plating, at least one metal on the metallized surface from an electrolytic solution, so as to give a thin metallic sheet having a metal thickness between 0.1 and 4 microns, the metallized substrate being selected so as to be compatible and facilitate the step of electrochemical plating, and the thin metallic sheet obtained being adherent and supported on said plastic film; and
   (iii) completely or partially transferring said metallic sheet from the plastic support to another surface having a higher adhesion with respect to the last plated metal than between the metallization and the plastic support.

3. A current collector for polymer electrolyte lithium batteries, consisting of metallic sheets obtained by a process comprising the following steps:
   (i) metallizing, under vacuum, at least one face of a plastic film so as to give a substrate having a metallic surface, said substrate being sufficiently electrically conductive to give a uniform electrochemical deposit;
   (ii) depositing by electrochemical plating, at least one metal on the metallized surface from an electrolytic solution, so as to give a thin metallic sheet having a metal thickness between 0.1 and 4 microns, the metallized substrate being selected so as to be compatible and facilitate the step of electrochemical plating, and the thin metallic sheet obtained being adherent and supported on said plastic film; and
   (iii) completely or partially transferring said metallic sheet from the plastic support to another surface having a higher adhesion with respect to the last plated metal than between the metallization and the plastic support.

4. A multi-layer film used as wrapping material having a very low permeability to gas and humidity, consisting of metallic sheets obtained by a process comprising the steps:
   (i) metallizing, under vacuum, at least one face of a plastic film so as to give a substrate having a metallic surface, said substrate being sufficiently electrically conductive to give a uniform electrochemical deposit;
   (ii) depositing by electrochemical plating, at least one metal on the metallized surface from an electrolytic solution, so as to give a thin metallic sheet having a metal thickness between 0.1 and 4 microns, the metallized substrate being selected so as to be compatible and facilitate the step of electrochemical plating, and the thin metallic sheet obtained being adherent and supported on said plastic film; and
   (iii) completely or partially transferring said metallic sheet from the plastic support to another surface having a higher adhesion with respect to the last plated metal than between the metallization and the plastic support.

* * * * *